(12) United States Patent
Lee

(10) Patent No.: US 11,815,985 B2
(45) Date of Patent: Nov. 14, 2023

(54) APPARATUS AND METHOD FOR CHECKING AN OPERATION STATUS OF A MEMORY DEVICE IN A MEMORY SYSTEM

(71) Applicant: SK hynix Inc., Gyeonggi-do (KR)

(72) Inventor: Jong-Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 131 days.

(21) Appl. No.: 16/715,817

(22) Filed: Dec. 16, 2019

(65) Prior Publication Data

US 2020/0310896 A1 Oct. 1, 2020

(30) Foreign Application Priority Data

Mar. 27, 2019 (KR) ........................ 10-2019-0035006

(51) Int. Cl.
| | |
|---|---|
| G06F 11/07 | (2006.01) |
| G06F 11/30 | (2006.01) |
| G06F 12/02 | (2006.01) |
| G11C 29/00 | (2006.01) |
| G11C 29/46 | (2006.01) |
| G11C 29/44 | (2006.01) |
| G11C 29/12 | (2006.01) |

(52) U.S. Cl.
CPC ........ *G06F 11/076* (2013.01); *G06F 11/3037* (2013.01); *G06F 12/0246* (2013.01); *G11C 29/44* (2013.01); *G11C 29/46* (2013.01); *G11C 29/886* (2013.01); *G06F 2212/7211* (2013.01); *G11C 2029/1202* (2013.01)

(58) Field of Classification Search
CPC ............... G06F 11/076; G06F 11/3037; G06F 12/0246; G06F 2212/7211; G06F 11/1048; G06F 2212/7205; G06F 2212/1024; G06F 2212/1032; G11C 29/886; G11C 29/46; G11C 29/44; G11C 2029/1202; G11C 2029/2602; G11C 29/4401; G11C 29/42; G11C 2029/0411; G11C 2029/0409; G11C 29/52; G11C 29/022
USPC ......................................... 714/704
See application file for complete search history.

(56) References Cited

U.S. PATENT DOCUMENTS

| | | | | |
|---|---|---|---|---|
| 7,730,368 | B2 * | 6/2010 | Murin | G11C 11/5621 365/201 |
| 8,112,682 | B2 * | 2/2012 | Lasser | G11C 29/08 714/733 |
| 9,471,418 | B1 * | 10/2016 | Ahn | G06F 11/1048 |
| 9,519,576 | B2 * | 12/2016 | Seo | G06F 12/0246 |
| 9,563,504 | B2 * | 2/2017 | Liang | G11C 16/349 |
| 11,301,388 | B2 * | 4/2022 | Ma | G06F 11/1068 |

(Continued)

FOREIGN PATENT DOCUMENTS

| | | |
|---|---|---|
| KR | 10-2016-0071948 | 6/2016 |
| KR | 10-1626528 | 6/2016 |

*Primary Examiner* — James C Kerveros
(74) *Attorney, Agent, or Firm* — IP & T GROUP LLP

(57) ABSTRACT

A memory system includes a memory device including a plurality of memory blocks, each including a plurality of memory cells coupled to a plurality of word lines, and a controller configured to determine an operation status regarding a selected memory block among the plurality of memory blocks by performing read test operations to the selected memory block in stages. During the read test operations, the controller adjusts the numbers of word lines selected in each of the stages, based on an error.

16 Claims, 9 Drawing Sheets

(56) References Cited

U.S. PATENT DOCUMENTS

| | | | |
|---|---|---|---|
| 2014/0101372 A1* | 4/2014 | Jung | G06F 11/1068 711/103 |
| 2014/0115419 A1* | 4/2014 | Ahn | G06F 11/1048 714/758 |
| 2016/0062827 A1* | 3/2016 | Yamauchi | G11C 16/3459 714/764 |
| 2016/0203047 A1* | 7/2016 | No | G06F 3/0604 714/764 |

* cited by examiner

APPARATUS AND METHOD FOR CHECKING AN OPERATION STATUS OF A MEMORY DEVICE IN A MEMORY SYSTEM

CROSS-REFERENCE TO RELATED APPLICATION

This patent application claims priority under 35 U.S.C. § 119(a) to Korean Patent Application No. 10-2019-0035006, filed on Mar. 27, 2019, the entire disclosure of which is incorporated herein by reference.

TECHNICAL FIELD

Various embodiments of the invention relate to a memory system, and more particularly, to a method and an apparatus for accessing a memory block in a memory device in a memory system to check an operation status.

BACKGROUND

Recently, a computer environment paradigm has shifted to ubiquitous computing, which enables a computer system to be accessed anytime and everywhere. As a result, the use of portable electronic devices such as mobile phones, digital cameras, notebook computers and the like has increased. Such a portable electronic device typically uses or includes a memory system that uses or embeds at least one memory device, i.e., a data storage device. The data storage device can be used as a main storage device or an auxiliary storage device of a portable electronic device.

Unlike a hard disk, a data storage device configured as a nonvolatile semiconductor memory device is advantageous in that it has excellent stability and durability because it has no mechanical driving part (e.g., a mechanical arm), and has high data access speed and low power consumption. Examples of such a data storage device include a USB (Universal Serial Bus) memory device, a memory card having various interfaces, and a solid state drive (SSD).

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
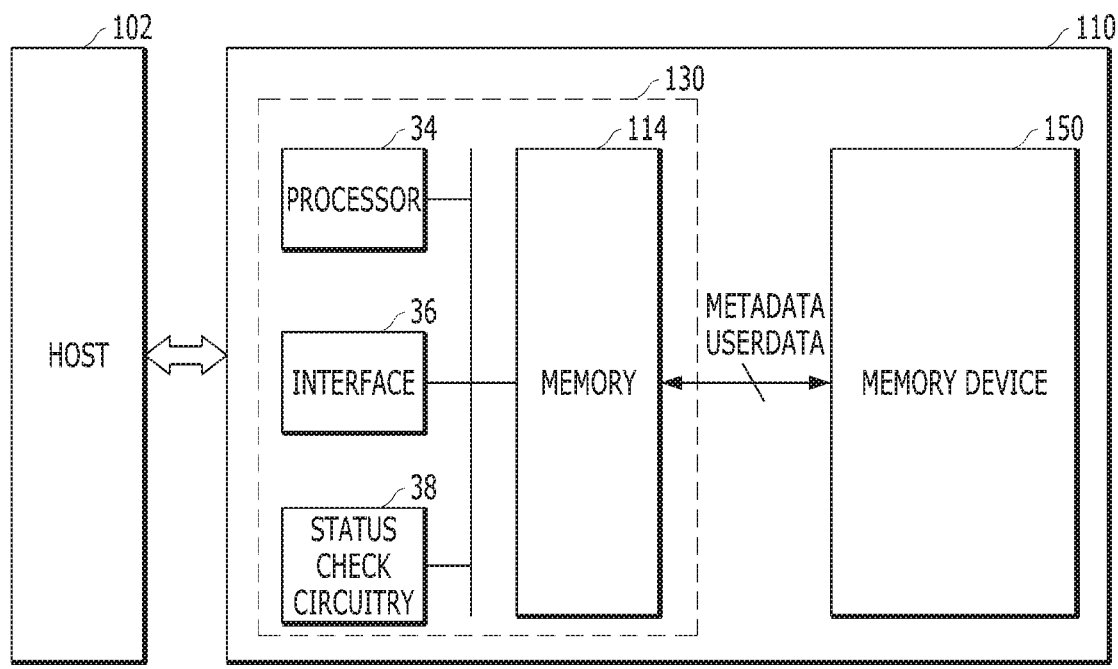
FIG. 1 shows a memory system according to an embodiment of the disclosure.

Various examples of the disclosure are described below in more detail with reference to the accompanying drawings. Aspects and features of the present invention, however, may be embodied in different ways to form other embodiments, including variations of any of the disclosed embodiments. Thus, the invention is not to be construed as being limited to the embodiments set forth herein. Rather, the described embodiments are provided so that this disclosure is thorough and complete and fully conveys the disclosure to those skilled in the art to which this invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change to the element itself.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via one or more intervening elements. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the invention. As used herein, singular forms are intended to include the plural forms and vice versa, unless the context clearly indicates otherwise.

It will be further understood that the terms "comprises," "comprising," "includes," and "including" when used in this specification, specify the presence of the stated elements but do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention belongs in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

An embodiment of the disclosure is directed to a memory system, a data processing system, and an operation process or a method, which can quickly and reliably process data into a memory device by reducing operational complexity and performance degradation of the memory system, thereby enhancing usage efficiency of the memory device.

In addition, the disclosure may provide a method and an apparatus for reducing read disturb that occurred in a memory block while accessing the memory block periodically or at a set time to check an operation status of the memory block in a memory system, thereby increasing a speed of the memory system.

The disclosure may provide a method and an apparatus for dynamically determining whether to access a memory block in response to an operation status of the memory block, including a plurality of nonvolatile memory cells, in a memory system so that the memory system may accurately estimate or determine an operation status of the memory block.

The disclosure can provide an apparatus and a method for reducing a wear leveling operation based on an operation status of a memory block in the memory system, which may be estimated and determined, so that reliability of data stored in the memory block may be improved as well as the number of read reclaim operations may be reduced.

In an embodiment, a memory system can include a memory device including a plurality of memory blocks, each including a plurality of memory cells coupled to a plurality of word lines; and a controller configured to determine an operation status regarding a selected memory block among the plurality of memory blocks by performing read test operations to the selected memory block in stages. During the read test operations, the controller can adjust the number of word lines selected in each of the stages, based on an error.

By the way of example but not limitation, in performing each of the read test operations, the controller can select some word lines coupled to the selected memory block, read data stored in memory cells coupled to selected word lines, and check the number of errors in the read data.

The controller can select a different number of word lines in a current stage than was selected in a previous stage based on the number of errors detected in a previous stage.

For example, at least one word line selected in the current stage can be spaced a set distance apart from a word line selected in the previous stage and in which the error was detected in the previous stage.

For another example, adjacent word lines selected in a current stage can be spaced apart from each other by a different distance than adjacent word lines selected in a previous read test operation.

The controller can be configured to determine that the operation status of the memory block is normal when there is no error in the read test operation. The controller can be configured to perform a read reclaim operation on the selected memory block when the error detected in the read test operation is below a set threshold.

The controller can be configured to determine that the operation status of the selected memory block is good when the error detected in the read test operation is below a set threshold. The selected memory block can be set as a priority monitored target. The controller can set the selected memory as the priority monitored target.

The controller can be configured to perform a read reclaim operation on the selected memory block when the error detected in the read test operation is over a set threshold, and to perform a bad block test operation on the selected memory block.

The controller can be configured to perform a wear leveling operation to the memory device when a number of memory blocks, each having a number of errors greater than or equal to an error threshold, is more than a set threshold.

The memory block in which the read test operations are performed can be selected because its read count has deviated from a set range during a set period.

In another embodiment, a method for operating a memory system can include determining whether to perform read test operations, each for determining an operation status of a memory block, based on a set condition; and performing the read test operations in stages on the memory block. Each of the read test operations are individually performed on a different number of word lines than each other of the read test operations, based on an error.

Each of the read test operations can include selecting some word lines coupled to the memory block, reading data stored in memory cells coupled to the selected word lines, and checking the number of errors in the read data.

The number of word lines selected in a current stage can be based on the number of errors detected in a previous stage.

For example, at least one word line selected in the current stage can be spaced a set distance apart from a word line selected in the previous stage and in which the error was detected in the previous stage.

For another example, adjacent word lines selected in a current stage are spaced apart from each other by a different distance than adjacent word lines selected in a previous read test operation.

The method can further include determining that the operation status of the memory block is normal when no error is detected in the read test operation, and performing a read reclaim operation to data read from the memory block when the error detected in the read test operation is below a set threshold.

The method can further include that the operation status of the selected memory block is good when the error detected in the read test operation is below a set threshold, and setting the memory block as a priority monitored target.

The method can further include performing a read reclaim operation on the selected memory block, when the error detected in the read test operation is over a set threshold; and performing a bad block test operation on the selected memory block.

The method can further include performing a wear leveling operation to the memory device when a number of memory blocks, each having a number of errors greater than or equal to an error threshold, is more than a set threshold.

The memory block in which the read test operations can be performed is selected because its read count has deviated from a set range during a set period.

An operating method of a controller for controlling a memory device including plural word lines can include controlling the memory device to perform a first read operation on a first set of word lines among the plural word lines; controlling the memory device, based on an error level of the first set of word lines detected in the first read operation, to perform a second read operation on a second set of word lines among the plural word lines; and controlling the memory device, based on an error level of the second set of word lines detected in the second read operation, to perform a read reclaim operation or a wear leveling operation on the plural word lines. Herein, the second read operation might be optional (i.e., skipped or omitted) when no error is detected in a piece of data accessed through the first read operation. A number of word lines in the second set can be based on the error level of the first set of word lines.

Embodiments of the disclosure are described in detail below with reference to the accompanying drawings, wherein like numbers reference like elements.

FIG. 1 describes a memory system 110 according to an embodiment of the disclosure. For example, in a computing device, a mobile or the like embedded with the memory system 110, a host 102 may be engaged with the memory system 110 for data input/output (I/O) operation.

Referring to FIG. 1, the memory system 110 can include a controller 130 and a memory device 150. The controller 130 may output data, which is requested by the host 102 and retrieved from the memory device 150, or store data transferred from the host 102 in the memory device 150. The memory device 150 includes a plurality of non-volatile memory cells, each capable of storing data. Here, an internal structure and/or configuration of the memory device 150 may be different depending on the specification or required performance of the memory device 150, which in turn may depend on the purpose(s) for which the memory system 110 is used or requirements of the host 102.

The controller 130 may include at least one processor 34, at least one memory 114, and at least one interface 36. The processor 34 may handle an operation or a process generated by an internal/external command within the controller 130, and in so doing, may perform functions the same or similar to that of a CPU in a computer. The interface 36 may include a host interface and a memory interface. The host interface may support communication between the memory system 110 and the host 102, and the controller interface can support communication between the memory device 150 and the controller 130. The memory 114 may support data transmission between the memory device 150 and the host 102. By way of example but not limitation, the controller 130 may be comprised of plural components, each of which may be primarily responsible for an operation or a task performed by the controller 130. In another embodiment, the controller 130 may be comprised of at least one component that performs multiple tasks or operations.

The memory 114 may be a volatile memory. For example, the memory 114 may include a static RAM (SRAM) or a dynamic RAM (DRAM). The memory 114 can temporarily store derived or generated data and/or operational status during the operation of the processor 34 and the interface 36.

The controller 130 can include state check circuitry 38. As used in the disclosure, the term 'circuitry' refers to any and all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/ software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware. The term "circuitry" also covers, for example and if applicable to a particular claim element, an integrated circuit for a storage device.

The state check circuitry 38 in the controller 130 may check an operation status regarding each of a plurality of memory blocks in the memory device 150. A plurality of nonvolatile memory cells may be coupled to each other through a plurality of word lines. The memory block may include a plurality of memory cells coupled via a plurality of word lines. A plurality of nonvolatile memory cells coupled to a single word line may form a page, which may be programmed with data together. By way of example but not limitation, when data is written to a plurality of nonvolatile memory cells coupled via a single word line, a single word line may correspond to a single page. Data stored in the nonvolatile memory cells of a single memory block may be deleted together.

After power is supplied to the memory system 110 or while the memory system 110 operates, the memory system 110 monitors whether each of a plurality of memory blocks in the memory device 150 operate or work normally. For example, directly after the power is supplied, the controller 130 may check whether a memory block that is a target for storing data in the memory device 150, or another memory block in which data has already stored, operates or works normally, determine whether the memory system 110 is ready to perform a program, read or erase operation based on the check, and then transmit a response corresponding an inquiry, a request or a command received from the host 102. Although the memory block includes a plurality of nonvolatile memory cells, data may be not permanently held by any such cells. A nonvolatile memory cell may have a data retention time indicating how long a data stored therein can be continuously maintained. Accordingly, the controller 130 may check an operational state of a memory block in the memory device 150 to ensure stability or reliability of data stored in the memory block.

In addition, as degree of integration of the memory device 150 increases, reading a piece of data stored in a specific memory cell may affect a threshold voltage of another memory cell located near or adjacent to the specific memory cell. This read disturb or interference in the memory device 150 may affect a piece of data stored in another memory cell. Thus, the controller 130 may periodically or occasionally check an operational state of a memory block in the memory device 150, even though data stored in the memory block is not accessed.

The state check circuitry 38 in the controller 130 may check an operational state of a memory block in the memory device 150. For example, the status check circuitry 38 may determine which memory block is to be checked among a plurality of memory blocks in the memory device 150. In addition, the state check circuitry 38 may read data stored in a selected memory block and determine an operational state of the selected memory block based on an error in, or an error rate of, read data.

In order to check the operational state regarding the memory block in the memory device 150, the state check circuitry 38 may sequentially read data stored in that memory block from the first page to the last page. This method has an advantage in that it is possible to check operational states of all the memory cells in the memory block, but has a disadvantage in that a lot of resources are consumed or required for checking the operational states of all the memory cells in the memory block. Further, another read disturb or interference may occur in the process of reading data from all memory cells in order to check the operational state of the memory block, which may deteriorate the operational state of the memory block while the check is being performed.

According to an embodiment, the state check circuitry 38 may perform read test operations in stages, or step by step, to check an operational state of the memory block. For checking the operational state of the memory block, the state check circuitry 38 may read only data stored in some pages of the memory block, not data stored in all pages of the memory block. A range of read data stored in the memory block may be dynamically determined based on an operation status of the memory block. For example, a piece of data is read from a page of the memory block. When it is determined that an operational state of the memory block is normal based on the piece of data, the read test operation for checking the operational state of the memory block may be stopped without reading another piece of data from another page of the memory block. If the piece of data includes an error, another piece of data from another page of the memory block is read for checking the operational state of the memory block.

By way of example but not limitation, it is assumed that a plurality of memory cells in a specific memory block are connected through 50 word lines. The status check circuitry 38 may first select five of the 50 word lines, and read data stored in memory cells connected via the five word lines. When there is no error in the data outputted from these memory cells, the status check circuitry 38 may determine that the operational state of the memory block is normal, without performing a read test operation on any of the other word lines (e.g., 45 word lines) of the memory block.

On the other hand, when an error is in all pieces of data outputted from the memory cells connected via the five word lines, the status check circuitry 38 may select some of the remaining (not previously selected) 45 word lines in the memory block, and perform a read test operation to those selected word lines. In the second selection of word lines, when there is an error in all pieces of data read from the first five word lines, the status check circuitry 38 may select more than five word lines (e.g., ten word lines) among the remaining 45 word lines, and read data outputted from memory cells connected via these selected word lines. As the read test operation proceeds in stages over time, the amount of read data may be increased in each succeeding stage.

On the other hand, if there is an error in some, but not all, pieces of data outputted from the memory cells connected via the five word lines, the status check circuitry 38 may select a fewer number of word lines (e.g., 3 of the remaining 45 word lines) in the memory block, and read data stored in memory cells connected to the selected word lines.

As described above, the state check circuitry 38 may perform a read test operation for checking an operational state regarding a specific memory block gradually or step by step. From the number or extent of the error(s) detected in the pieces of data read in a previous stage, how many pieces of data are to be read in a next stage may be determined. The number of word lines selected for performing the read test operation can be adjusted.

According to an embodiment, the state check circuitry 38 may select the first word line and the tenth word line of a specific memory block to perform a read test operation. When no error is found in data outputted from a plurality of memory cells connected via the first word line, the status check circuitry 38 may not select the second word line for the read test operation. On the other hand, when there is an error in data outputted from memory cells connected via the tenth word line, the status check circuitry 38 may select the eleventh word line for the read test operation. Thus, the read test operation may be performed individually and differently for each of plural regions in a single memory block.

According to an embodiment, the state check circuitry 38 may determine an operational state of a specific memory block as any of multiple classes or levels based on the number of errors in data outputted from the memory cells connected via the word line(s) checked. For example, when a piece of data outputted from a plurality of memory cells connected to a specific word line contains no error, an operational state regarding those memory cells may be determined to be normal.

When an error is detected in the piece of data outputted from a plurality of memory cells connected to the word line but the error can be corrected through an operation using an error correction code (ECC), the operational state regarding the plurality of memory cells may be determined to be good. Moreover, according to an embodiment, the operational state regarding the plurality of memory cells may be determined to be any of multiple classes or levels based on a level at which an error can be corrected, that is, the severity of the error.

When there is an error in the piece of data outputted from a plurality of memory cells connected to a specific word line and the error cannot be cured or corrected through an operation using an error correction code (ECC) or the like, an operational state regarding the plurality of memory cells may be determined to be abnormal.

The operational state of a memory block can be determined based on operational states regarding a plurality of memory cells included in a memory block. The state check circuitry 38 may determine an operational state regarding a plurality of memory cells connected via a word line, and then perform a read test operation on a plurality of other memory cells connected via another word line according to a determined operational state. In addition, when the operational state of the memory block is determined through at least one read test operation performed to at least one word line, a read reclaim operation or a wear leveling operation can be performed to the corresponding memory block.

According to an embodiment, the controller 130 can include physical components including at least one processor, at least one memory, at least one input/output port, one or more wires or connection paths for electrically coupling such components, and the like.

The controller 130 and the memory device 150 can exchange metadata and user data. Herein, the user data can include various data to be inputted and stored by the user through the host 102, and the metadata can include system information (for example, map data and the like) used for storing the user data in the memory device 150. The user data and the meta data can be processed or managed in different ways in the controller 130 since characteristics or properties thereof are different from each other.

Even with increased storage capacity of the memory device 150, it is difficult for the controller 130 to store all status information including system information, map information, operational state information and the like, which are used, or referred to, for operations such as a read operation, a program operation and an erase operation performed with a plurality of dies, a plurality of blocks, or a plurality of pages included in the memory device 150. As the storage capacity increases, the amount of status information may increase as well. It might be difficult to include within the controller 130 additional memory having enough storage capacity for all status information.

Accordingly, the memory device 150 can be used to store the user data as well as various status information including the system information, the map information, the operational state information, and the like for operations such as a read operation, a program operation and an erase operation. The controller 130 may load some or partial status information stored in the memory device 150 for operations such as a read operation, a program operation and an erase operation performed with a plurality of dies, a plurality of blocks, or a plurality of pages. After completing the operations, the controller 130 can store updated and loaded status information in the memory device 150.

Although not shown, as the number of cells capable of storing data in the memory device 150 increases, an internal configuration or structure of the memory device 150 may become more complicated as described with reference to FIG. 7. The controller 130 may transmit to, or receive from, the memory device 150 data with connection information according to the internal configuration or structure of the memory device 150. For example, when a plurality of dies is included in the memory device 150, the controller 130 can exchange data through n channels and m ways with the memory device 150. However, in order for the controller 130 to read or write data from or to the memory device 150, additional control variables or control signals may be required depending on the internal configuration or structure of the memory device 150.

For example, the host 102 and the memory system 110 can exchange commands, addresses, data, and the like with each other, according to a protocol, a system communication method, or an interface. Thus, the host 102 may not need to be aware of the specific structure within the memory system 110. When the host 102 stores specific data to the memory system 110 or attempts to read data stored in the memory system 110, the host 102 sends a logical block address (LBA). Here, the logical block address (LBA) is a logical block addressing method, and may be a format used to specify the location of a data block to be recorded in a storage device associated with a computing device. For example, in the case of a conventional hard disk, an addressing method indicating a physical structure included in a hard disk, such as a cylinder, a head, and a sector (Cylinder-Head-Sector, CHS) was used. However, the address system corresponding to the physical structure of the hard disk has reached the limit as the storage capacity of the hard disk increases. In such a large-capacity storage device, the address can be specified in a manner that the sectors are arranged in a logical sequence in a row, and the sectors are numbered (for example, in order from 0), regardless of the physical structure of the hard disk. Instead of the host 10 transferring or pointing data only to the logical block address (LBA), the controller 130 in the memory system 110 may store and manage the physical address, which is the address in the memory device 150, where the actual data is stored. It is necessary to match and manage the logical block address (LBA) used by the host 102. Such information may be included in a metadata and may be distinguished from a user data stored or read by the host 102.

As the amount of data that can be stored in the memory device 150 increases, efficient management of metadata may be required. Also, as the size of the plurality of blocks included in the memory device 150 increases, the amount of data that can be stored increases; the amount of metadata also increases. This increases the resources (e.g., time) required to maintain and manage the stored data in the memory device 150, so that an apparatus and method for increasing the operational efficiency, stability, or reliability of the memory system 110 may be required.

Figure 2:
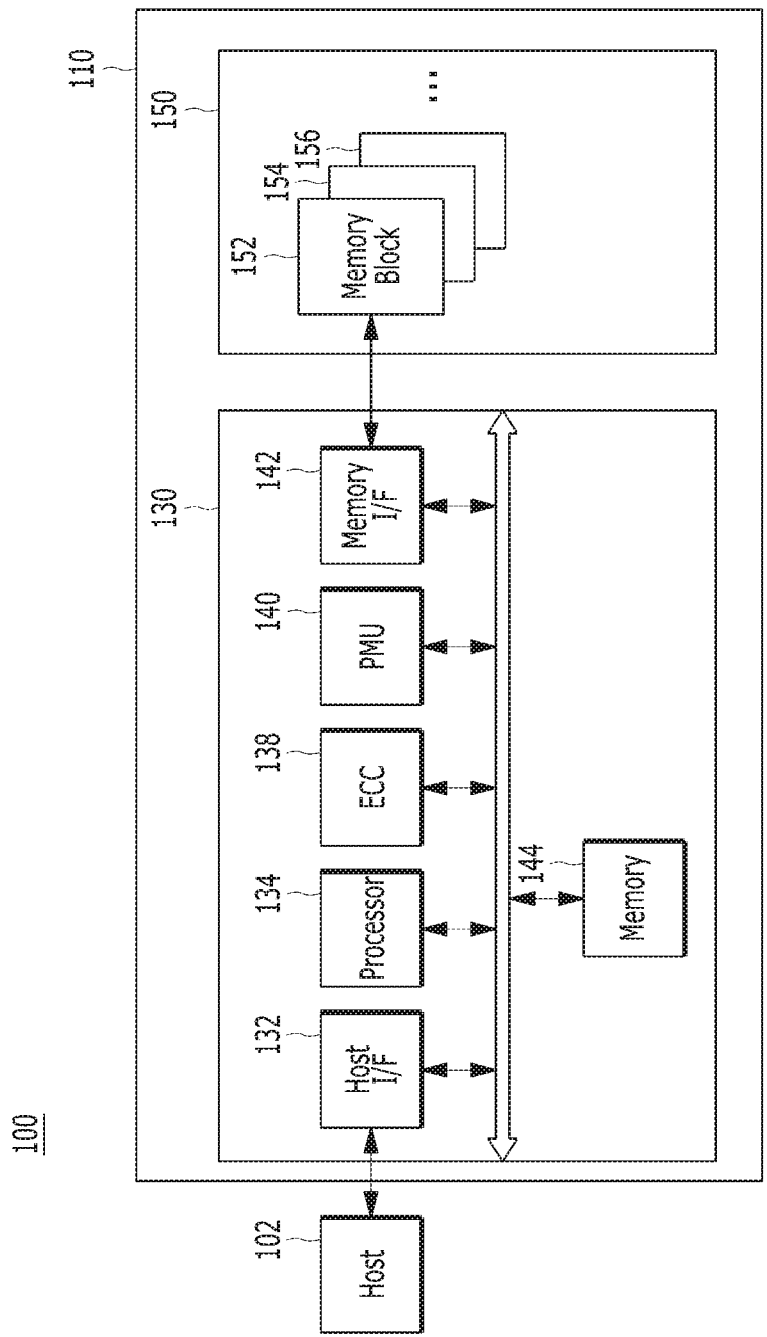
FIG. 2 illustrates a data processing system including a memory system according to an embodiment of the disclosure.

In FIG. 2, a data processing system 100 in accordance with an embodiment of the disclosure may include a host 102 engaged or operably coupled with a memory system 110.

The host 102 may include, for example, any of a variety of portable electronic devices, such as a mobile phone, an MP3 player and a laptop computer, or an electronic device such as a desktop computer, a game player, a television (TV), a projector and the like.

The host 102 also includes at least one operating system (OS), which can generally manage, and control, functions and operations performed in the host 102. The OS can provide interoperability between the host 102 engaged with the memory system 110 and the user of the memory system 110. The OS may support functions and operations corresponding to user's requests. By way of example but not limitation, the OS may include a general operating system and a mobile operating system according to mobility of the host 102. The general operating system may be split into a personal operating system and an enterprise operating system according to system requirements or user's environment. The personal operating system, including Windows and Chrome, may be subject to support services for general purposes. But the enterprise operating systems can be specialized for securing and supporting high performance, including Windows servers, Linux, Unix and the like. Further, the mobile operating system may include an Android, an iOS, a Windows mobile and the like. The mobile operating system may be subject to support services or functions for mobility (e.g., a power saving function). The host 102 may include a plurality of operating systems. The host 102 may execute multiple operating systems coupled with the memory system 110, corresponding to a user's request. The host 102 may transmit a plurality of commands corresponding to the user's requests into the memory system 110, thereby performing operations corresponding to commands within the memory system 110. Handling plural commands in the memory system 110 is described below with reference to FIGS. 4 and 5.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, for example, a dynamic random access memory (DRAM) or a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) or a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as exemplified above.

By way of example but not limitation, the controller 130 and the memory device 150 may be integrated into a single semiconductor device. The controller 130 and memory device 150 may be so integrated to form an SSD for improving operation speed. When the memory system 110 is used as an SSD, the operating speed of the host 102 connected to the memory system 110 can be improved more than that of the host 102 connected with a hard disk. In another embodiment, the controller 130 and the memory device 150 may be integrated into one semiconductor device to form a memory card, such as a PC card (PCMCIA), a compact flash card (CF), a smart media card (SM, SMC), a memory stick, a multimedia card (MMC, RS-MMC, MMC-micro), a SD card (SD, miniSD, mic oSD, SDHC), or a universal flash memory.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided from the host 102 through a write operation, while providing data stored therein to the host 102 through a read operation. The memory device 150 may include a plurality of memory blocks 152, 154, 156, each of which may include a plurality of pages. Each of the plurality of pages may include a plurality of memory cells to which a plurality of word lines (WL) are electrically coupled. The memory device 150 also includes a plurality of memory dies, each of which includes a plurality of planes, each of which includes a subset of memory blocks 152, 154, 156. In addition, the memory device 150 may be a non-volatile memory device, for example a flash memory, wherein the flash memory may be a three-dimensional stack structure.

The controller 130 may control overall operations of the memory device 150, such as read, write, program and erase operations. For example, the controller 130 may control the memory device 150 in response to a request from the host 102. The controller 130 may provide the data, read from the memory device 150, with the host 102. The controller 130 may store the data, provided by the host 102, into the memory device 150.

The controller 130 may include a host interface (I/F) 132, a processor 134, an error correction code (ECC) component 138, a power management unit (PMU) 140, a memory interface (I/F) 142 and a memory 144, all operatively coupled via an internal bus.

The host interface 132 may process commands and data provided from the host 102, and may communicate with the host 102 through at least one of various interface protocols, such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (DATA), small computer system interface (SCSI), enhanced small disk interface (ESDI) and/or integrated drive electronics (IDE). In accordance with an embodiment, the host interface 132 is a component for exchanging data with the host 102, which may be implemented through firmware called a host interface layer (HIL).

The ECC component 138 can correct error bits of the data to be processed in (e.g., outputted from) the memory device 150, which may include an ECC encoder and an ECC decoder. Here, the ECC encoder can perform error correction encoding of data to be programmed in the memory device 150 to generate encoded data into which a parity bit is added and store the encoded data in memory device 150. The ECC decoder can detect and correct errors contained in a data read from the memory device 150 when the controller 130 reads the data stored in the memory device 150. In other words, after performing error correction decoding on the data read from the memory device 150, the ECC component 138 can determine whether the error correction decoding has succeeded and output an instruction signal (e.g., a correction success signal or a correction fail signal). The ECC component 138 can use the parity bit which is generated during the ECC encoding process, for correcting the error bit of the read data.

When the number of the error bits is greater than or equal to a threshold number of correctable error bits, the ECC component 138 may not correct error bits but instead may output an error correction fail signal indicating failure in correcting the error bits.

The ECC component 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), or a Block coded modulation (BCM). The ECC component 138 may include any combination of circuits, modules, systems or devices for performing the error correction operation based on at least one of the above described codes.

The PMU 140 may manage an electrical power provided in the controller 130.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134 in a case when the memory device 150 is a flash memory and, in particular, when the memory device 150 is a NAND flash memory. The memory interface 142 can provide an interface for handling commands and data between the controller 130 and the memory device 150, for example, operations of NAND flash interface, in particular, operations between the controller 130 and the memory device 150. In accordance with an embodiment, the memory interface 142 can be implemented through firmware called a Flash Interface Layer (FIL) as a component for exchanging data with the memory device 150.

The memory 144 may support operations performed by the memory system 110 and the controller 130. The memory 144 may store temporary or transactional data generated or delivered for operations in the memory system 110 and the controller 130. The controller 130 may control the memory device 150 in response to a request from the host 102. The controller 130 may deliver data read from the memory device 150 into the host 102. The controller 130 may store data received from the host 102 within the memory device 150. The memory 144 may be used to store data required for the controller 130 and the memory device 150 to perform operations such as read operations or program/write operations.

The memory 144 may be implemented with a volatile memory. The memory 144 may be implemented with a static random access memory (SRAM), a dynamic random access memory (DRAM) or both. Although FIG. 1 exemplifies the memory 144 disposed within the controller 130, the present invention is not limited to that arrangement. That is, the memory 144 may be within or externally to the controller 130. For instance, the memory 144 may be embodied by an external volatile memory having a memory interface transferring data and/or signals between the memory 144 and the controller 130.

The memory 144 can store data necessary for performing operations such as data writing and data reading requested by the host 102 and/or data transfer between the memory device 150 and the controller 130 for background operations such as garbage collection and wear levelling as described above. In accordance with an embodiment, for supporting operations in the memory system 110, the memory 144 may include a program memory, a data memory, a write buffer/cache, a read buffer/cache, a data buffer/cache, a map buffer/cache, and the like.

The processor 134 may be implemented with a microprocessor and/or a central processing unit (CPU). The memory system 110 may include one or more processors 134. The processor 134 may control the overall operations of the memory system 110. By way of example but not limitation, the processor 134 can control a program operation or a read operation of the memory device 150, in response to a write request or a read request entered from the host 102. In accordance with an embodiment, the processor 134 may use or execute firmware to control the overall operations of the memory system 110. Herein, the firmware may be referred to as a flash translation layer (FTL). The FTL may serve as an interface between the host 102 and the memory device 150. The host 102 may transmit requests for write and read operations to the memory device 150 through the FTL.

The FTL may manage operations of address mapping, garbage collection, wear-leveling and the like. Particularly, the FTL may load, generate, update, or store map data. Therefore, the controller 130 may map a logical address, which is received from the host 102, with a physical address of the memory device 150 through the map data. The memory device 150 may otherwise function as a general storage device to perform a read or write operation because of the address mapping operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the particular page to the newly programmed page) due to a characteristic of a flash memory device. Further, the controller 130 may store map data of the new data into the FTL.

For example, when performing an operation requested from the host 102 in the memory device 150, the controller 130 uses the processor 134. The processor 134 engaged with the memory device 150 can handle instructions or commands corresponding to an inputted command from the host 102. The controller 130 can perform a foreground operation as a command operation, corresponding to an command inputted from the host 102, such as a program operation corresponding to a write command, a read operation corresponding to a read command, an erase/discard operation corresponding to an erase/discard command and a parameter set operation corresponding to a set parameter command or a set feature command with a set command.

For another example, the controller 130 may perform a background operation on the memory device 150 through the processor 134. By way of example but not limitation, the background operation for the memory device 150 includes copying data in a memory block, among the memory blocks 152, 154, 156, and storing such data in another memory block (e.g., a garbage collection (GC) operation). The background operation can include moving data among memory blocks of the memory blocks 152, 154, 156 (e.g., a wear leveling (WL) operation). During a background operation, the controller 130 may use the processor 134 for storing the map data stored in the controller 130 to at least one of the memory blocks 152, 154, 156, e.g., a map flush operation. A bad block management operation of checking for bad blocks among the plurality of memory blocks 152, 154, 156 is another example of a background operation performed by the processor 134.

In the memory system 110, the controller 130 performs a plurality of command operations corresponding to a plurality of commands received from the host 102. For example, when performing a plurality of read operations corresponding to plural read commands and a plurality of erase operations corresponding to plural erase commands sequentially, randomly or alternatively, the controller 130 can determine which channel(s) or way(s) for connecting the controller 130 to which memory die(s) in the memory 150 is/are proper or appropriate for performing each operation. The controller 130 can send or transmit data or instructions via the determined channel(s) or way(s) for performing each operation. The plurality of memory dies can transmit an operation result via the same channel(s) or way(s), respectively, after each operation is complete. Then, the controller 130 may transmit a response or an acknowledge signal to the host 102. In an embodiment, the controller 130 can check a status of each channel or each way. In response to a command received from the host 102, the controller 130 may select at least one channel or way based on the status of each channel or each way so that instructions and/or operation results with data may be delivered via selected channels) or way(s).

By way of example but not limitation, the controller 130 can recognize the status of each of the channels (or ways) associated with memory dies in the memory device 150. The controller 130 may recognize each channel or each way as being in a busy state, a ready state, an active state, an idle state, a normal state, or an abnormal state. The controller's determination of which channel or way an instruction (and/or a data) is delivered through can be based on a physical block address, e.g., to which die(s) the instruction (and/or the data) is delivered. The controller 130 can refer to descriptors delivered from the memory device 150. The descriptors can include a block or page of parameters that describe informative items about the memory device 150. Each descriptor may be data with a set format or structure. For instance, the descriptors may include device descriptors, configuration descriptors, unit descriptors, and the like. The controller 130 can refer to, or use, the descriptors to determine with which channel(s) or way(s) an instruction or a data is exchanged.

A management unit (not shown) may be included in the processor 134. The management unit may perform bad block management of the memory device 150. The management unit may find bad memory blocks, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 110. Thus, reliable bad block management may enhance or improve performance of the memory system 110.

Figure 3:
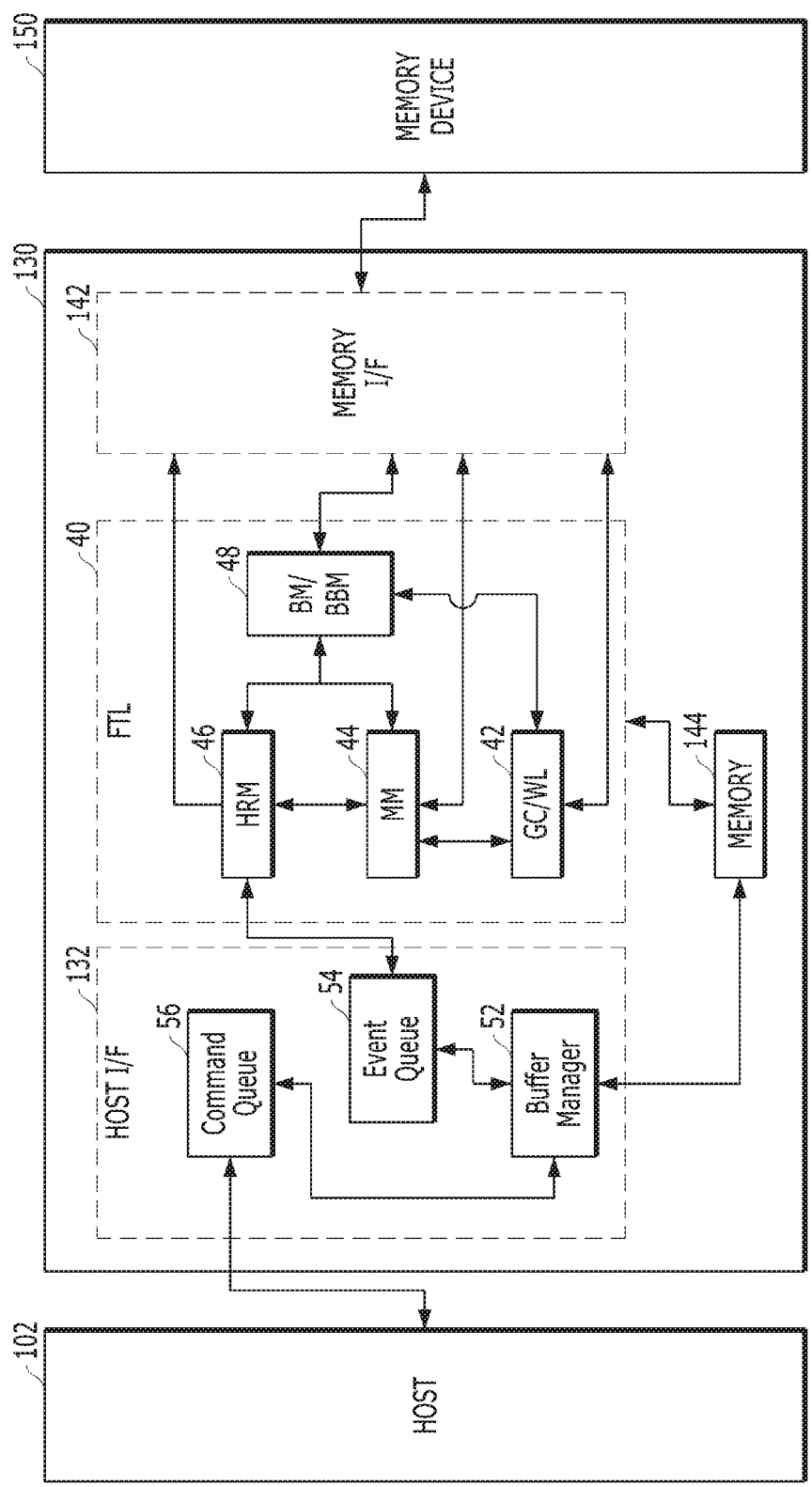
FIG. 3 illustrates a controller in a memory system according to an embodiment of the disclosure.

Referring to FIG. 3, a controller in a memory system in accordance with another example of the disclosure is described in detail. The controller 130 cooperates with the host 102 and the memory device 150. The controller 130 can include a host interface 132, a flash translation layer (FTL) 240, a memory interface 142 and a memory 144.

Although not shown in FIG. 3, in accordance with an embodiment, the ECC component 138 described in FIG. 2 may be included in the flash translation layer (FTL) 240. In another embodiment, the ECC component 138 may be implemented as a separate module, a circuit, firmware or the like, which is included in, or associated with, the controller 130.

The host interface 132 is for handling commands, data, and the like transmitted from the host 102. By way of example but not limitation, the host interface 132 can include a command queue 56, a buffer manager 52 and an event queue 54. The command queue 56 can sequentially store commands, data, and the like transmitted from the host 102 and output them to the buffer manager 52 in the order in which the commands are stored. The buffer manager 52 can classify, manage or adjust the commands, the data, and the like, which are delivered from the command queue 56. The event queue 54 can sequentially transmit events for processing the commands, the data, and the like transmitted from the buffer manager 52.

A plurality of commands or data of the same characteristic may be continuously transmitted from the host 102, or commands and data of different characteristics may be transmitted to the memory system 110 after being mixed or jumbled. For example, a plurality of commands for reading data (read commands) may be delivered, or commands for reading data (read commands) and programming/writing data (write commands) may be alternately transmitted to the memory system 110. The host interface 132 can store commands, data, and the like, which are transmitted from the host 102, to the command queue 56 sequentially. Thereafter, the host interface 132 can estimate or predict what kind of internal operation the controller 130 will perform according to the characteristics of the command, data, etc., which is transmitted from the host 102. The host interface 132 can determine a processing order and a priority of commands, data and the like, based at least on their characteristics. According to characteristics of commands, data, and the like transmitted from the host 102, the buffer manager 52 in the host interface 132 is configured to determine whether the buffer manager 52 should store commands, data, and the like in the memory 144, or whether the buffer manager should deliver the commands, the data, and the like into the flash translation layer (FTL) 240. The event queue 54 receives events, entered from the buffer manager 52, which are to be internally executed and processed by the memory system 110 or the controller 130 in response to the commands, the data, etc. transmitted from the host 102, so as to deliver the events into the flash translation layer (FTL) 240 in the order received.

In accordance with an embodiment, the host interface 132 described in FIG. 3 may perform the functions of the controller 130 described in FIG. 1.

In accordance with an embodiment, the flash translation layer (FTL) 240 can include a host request manager (HRM) 46, a map manager (MM) 44, a state manager (GC/WL) 42 and a block manager (BM/BBM) 48. The host request manager 46 can manage the events entered from the event queue 54. The map manager 44 can handle or control a map data. The state manager 42 can perform garbage collection or wear leveling. The block manager 48 can execute commands or instructions on a block in the memory device 150.

By way of example but not limitation, the host request manager 46 can use the map manager 44 and the block manager 48 to handle or process requests according to the read and program commands, and events which are delivered from the host interface 132. The host request manager 46 can send an inquiry request to the map data manager 44, to determine a physical address corresponding to the logical address which is entered with the events. The host request manager 46 can send a read request with the physical address to the memory interface 142, to process the read requester or handle the events. On the other hand, the host request manager 46 can send a program request (write request) to the block manager 48, to program entered data to an empty page (having no data) in the memory device 150 and then, can transmit a map update request corresponding to the program request to the map manager 44, to update an item relevant to the programmed data in information of mapping the logical-physical addresses to each other.

Here, the block manager 48 can convert a program request delivered from the host request manager 46, the map data manager 44, and/or the state manager 42 into a flash program request used for the memory device 150, to manage flash blocks in the memory device 150. In order to maximize or enhance program or write performance of the memory system 110 (see FIG. 2), the block manager 48 may collect program requests and send flash program requests for multiple-plane and one-shot program operations to the memory interface 142. The block manager 48 may send several flash program requests to the memory interface 142 to enhance or maximize parallel processing of the multi-channel and multi-directional flash controller.

On the other hand, the block manager 48 can be configured to manage blocks in the memory device 150 according to the number of valid pages, select and erase blocks having no valid pages when a free block is needed, and select a block including the least number of valid pages when it is determined that garbage collection is necessary. The state manager 42 can perform garbage collection to move valid data to an empty block and erase data remaining in the blocks from which the valid data was moved so that the block manager 48 may have enough free blocks (empty blocks with no data). If the block manager 48 provides information regarding a block to be erased to the state manager 42, the state manager 42 is able to check all flash pages of the block to be erased to determine whether each page is valid. For example, to determine validity of each page, the state manager 42 can identify a logical address recorded in an out-of-band (00B) area of each page. To determine whether each page is valid, the state manager 42 can compare the physical address of the page with the physical address mapped to the logical address obtained from the request. The state manager 42 sends a program request to the block manager 48 for each valid page. A mapping table can be updated through the update of the map manager 44 when the program operation is complete.

The map manager 44 can manage a logical-physical mapping table. The map manager 44 can process requests such as queries, updates, and the like, which are generated by the host request manager (HRM) 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request can be sent to the block manager 48 so that a clean cache block is made and the dirty map table may be stored in the memory device 150.

On the other hand, when garbage collection is performed, the state manager 42 copies valid page(s) into a free block, and the host request manager 46 can program the latest version of the data for the same logical address of the page and currently issue an update request. When the status manager 42 requests the map update in a state in which copying of valid page(s) has not been completed, the map manager 44 may not perform the mapping table update. This is because the map request is issued with old physical information if the status manger 42 requests a map update and a valid page copy is not completed until later. The map manager 44 may perform a map update operation to ensure accuracy only if the latest map table still points to the old physical address.

In accordance with an embodiment, at least one of the state manager 42, the map manager 44 or the block manager 48 can include the operation information confirmation circuitry 124 shown in FIG. 1.

The memory device 150 can include a plurality of memory blocks. The plurality of memory blocks can be different types of memory blocks, such as a single level cell (SLC) memory block or a multi level cell (MLC) memory block, according to the number of bits that can be stored or represented in one memory cell of such block. Here, the SLC memory block includes a plurality of pages implemented by memory cells, each storing one bit of data. The SLC memory block can have high data I/O operation performance and high durability. The MLC memory block includes a plurality of pages implemented by memory cells, each storing multi-bit data (e.g., two bits or more). The MLC memory block can have a larger storage capacity for the same space compared to the SLC memory block. The MLC memory block can be highly integrated in terms of storage capacity. In an embodiment, the memory device 150 may be implemented with MLC memory blocks, such as a double level cell memory block, a triple level cell (TLC) memory block, a quadruple level cell (QLC) memory block or a combination thereof. The double level memory block may include a plurality of pages implemented by memory cells, each capable of storing 2-bit data. The triple level cell (TLC) memory block can include a plurality of pages implemented by memory cells, each capable of storing 3-bit data. The quadruple level cell (QLC) memory block can include a plurality of pages implemented by memory cells, each capable of storing 4-bit data. In another embodiment, the memory device 150 can be implemented with a block including a plurality of pages implemented by memory cells, each capable of storing 5-bit or more bit data.

In an embodiment of the disclosure, the memory device 150 is embodied as a nonvolatile memory such as a flash memory such as a NAND flash memory, a NOR flash memory and the like. In another embodiment, the memory device 150 may be implemented by at least one of a phase change random access memory (PCRAM), a ferroelectrics random access memory (FRAM), a spin injection magnetic memory (e.g., a spin transfer torque magnetic random access memory, STT-MRAM), or the like.

Figure 4:
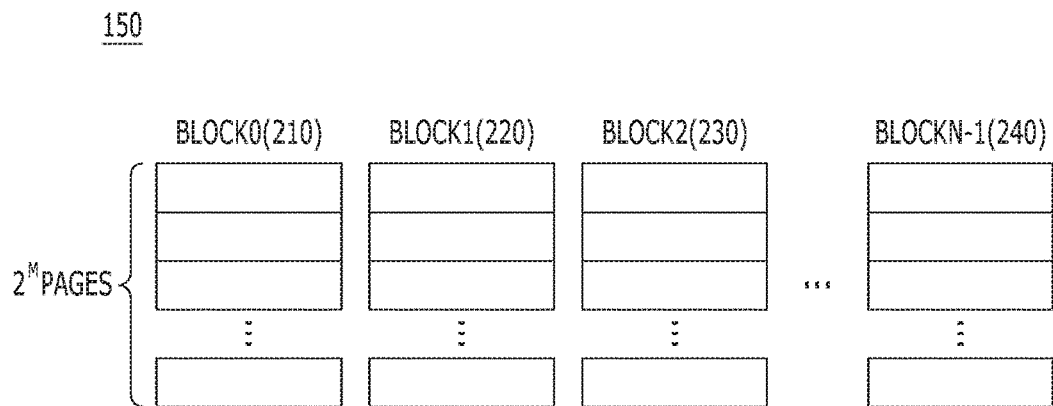
FIG. 4 shows an example of a memory device in a memory system according to an embodiment of the invention.
Figure 5:
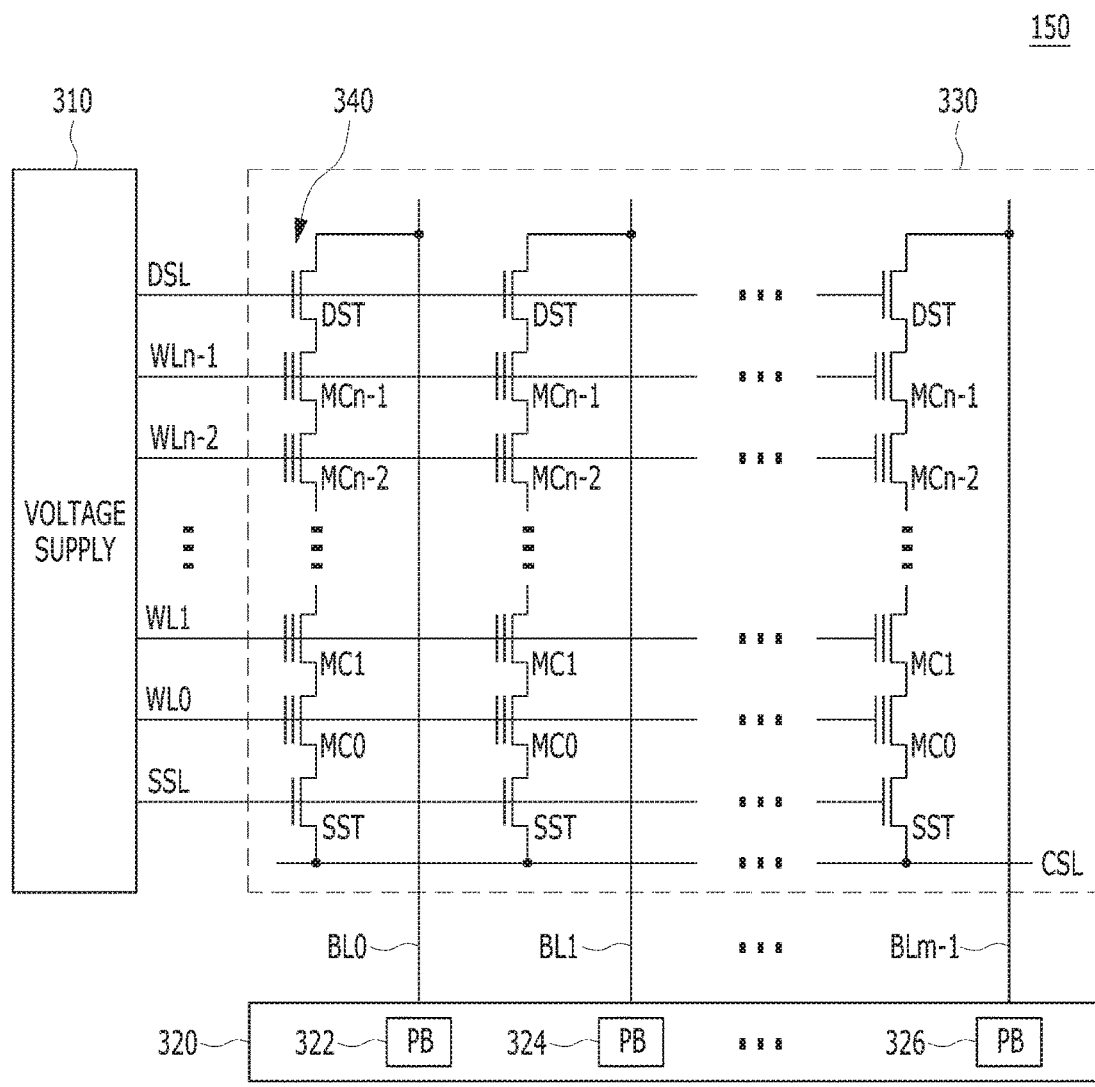
FIG. 5 illustrates a non-volatile memory cell array in memory blocks in a memory device according to an embodiment of the invention.
Figure 6:
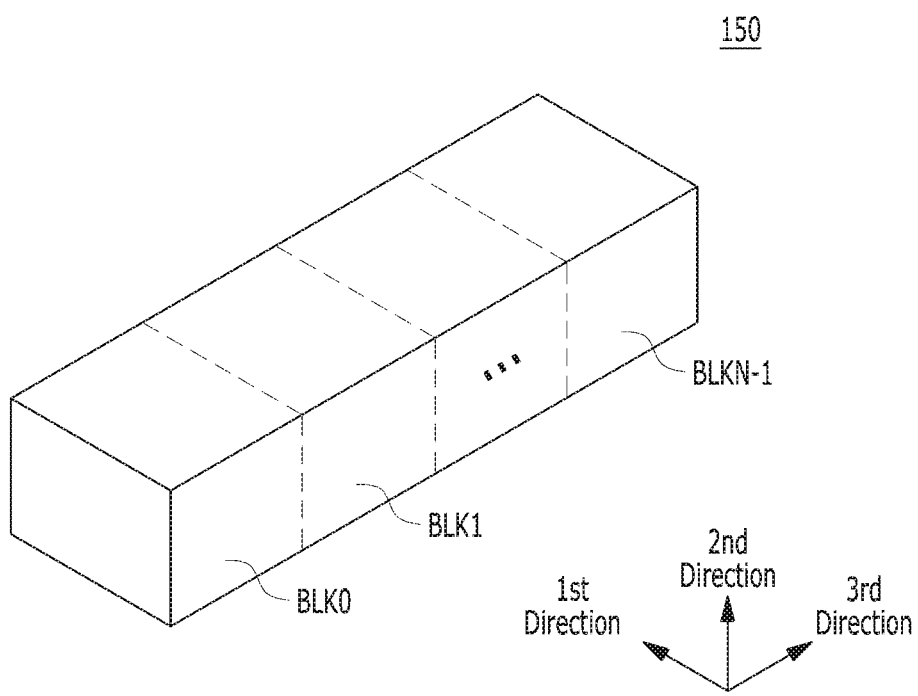
FIG. 6 shows a memory device structure in a memory system according to an embodiment of the invention.

FIG. 4 shows an example of a memory device in a memory system according to an embodiment of the invention, FIG. 5 shows a non-volatile memory cell array in memory blocks in a memory device according to an embodiment of the invention, and FIG. 6 shows an example of a 3-dimensional memory device structure in a memory system according to an embodiment of the invention.

Referring to FIG. 4, the memory device 150 can include a plurality of memory blocks, such as a first block (BLOCK0) 210, a second block (BLOCK1) 220, a third block (BLOCK2) 230, and an nth block (BLOCKN−1) 240. Each of blocks 210, 220, 230, 240 can include a plurality of pages, e.g., $2M^1$ pages, or M pages. Here, n and M are natural numbers. Herein, it is assumed that each of memory blocks includes 2M pages. Each of the pages can include a plurality of non-volatile memory cells coupled via at least one word line (WL) with each other.

The memory device 150 can include a plurality of memory blocks. Each of the plurality of memory blocks may be any of different types of memory blocks such as a single level cell (SLC) memory block, a multi-level cell (MLC) memory block or the like, according to the number of bits that can be stored or represented in one memory cell. Here, the SLC memory block includes a plurality of pages implemented by memory cells, each storing one bit of data. The SLC memory block can have high data I/O operation performance and high durability. The MLC memory block includes a plurality of pages implemented by memory cells, each storing multi-bit data (e.g., two bits or more). The MLC memory block can have larger storage capacity than the SLC memory block. The MLC memory block can be highly integrated to provide larger storage capacity within the same amount of space as the SLC memory block. In an embodiment, the memory device 150 may be implemented with MLC memory blocks such as an MLC memory block, a triple level cell (TLC) memory block, a quadruple level cell (QLC) memory block and a combination thereof. The MLC memory block may include a plurality of pages implemented by memory cells, each capable of storing 2-bit data. The triple level cell (TLC) memory block can include a plurality of pages implemented by memory cells, each capable of storing 3-bit data. The quadruple level cell (QLC) memory block can include a plurality of pages implemented by memory cells, each capable of storing 4-bit data. In another embodiment, the memory device 150 can be implemented with a block including a plurality of pages implemented by memory cells, each capable of storing 5-bit or more bit data.

In an embodiment of the disclosure, the memory device 150 is embodied as a nonvolatile memory such as a flash memory, e.g., a NAND flash memory, a NOR flash memory and the like. In other embodiments, the memory device 150 may be implemented by at least one of a phase change random access memory (PCRAM), a ferroelectrics random access memory (FRAM), a spin injection magnetic memory (STT-RAM), and a spin transfer torque magnetic random access memory (STT-MRAM), or the like.

Each of the blocks 210, 220, 230, 240 in the memory device 150 can store data provided from the host 102 through a program operation and provide the stored data to the host 102 through a read operation.

Referring to FIG. 5, a memory block 330 which may correspond to any of the plurality of memory blocks 152, 154, 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST, SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 5 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage (power) supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and may supply a current or a voltage onto bit lines according to the received data. The read/write circuit 320 may include a plurality of page buffers 322, 324, 326 respectively corresponding to columns (or bit lines) or column pairs (or bit line pairs). Each of the page buffers 322, 324, 326 may include a plurality of latches (not illustrated).

In addition, the memory device 150 may be implemented as a two-dimensional or three-dimensional memory device, and may be implemented as a non-volatile memory device of a three-dimensional solid stack structure. The memory device 150 may include a plurality of memory blocks BLK0 to BLKN−1. FIG. 6 is a block diagram showing the memory blocks 152, 154, 156 of the memory device 150. Each of the memory blocks 152, 154, 156 can be implemented as a three-dimensional structure. For example, each of the memory blocks 152, 154, 156 may be realized by a structure with dimensions extending in mutually orthogonal directions, e.g., an x-axis direction, a y-axis direction, and a z-axis direction.

By the way of example but not limitation, each memory block 330 included in the memory device 150 may include a plurality of NAND strings (NSs) extending along a second direction, and/or can be provided with a plurality of NAND strings (NSs) along with a first direction or a third direction. Here, each NAND string NS is coupled with I/O control circuits via at least one of a bit line BL, at least one string select line SSL, at least one ground select line GSL, a plurality of word lines WL, at least one dummy word Line DWL and a common source line CSL. The NAND string (NS) may include a plurality of transistors for switching on plural lines.

Each of the plurality of memory blocks 152, 154, 156 in the memory device 150 can include a plurality of bit lines BL, a plurality of string select lines SSL, a plurality of NAND strings GSL, a plurality of word lines WL, a plurality of dummy word lines DWL and a plurality of common source lines CSL. Each memory block 330 includes a plurality of NAND strings as shown in FIG. 5.

Figure 7:
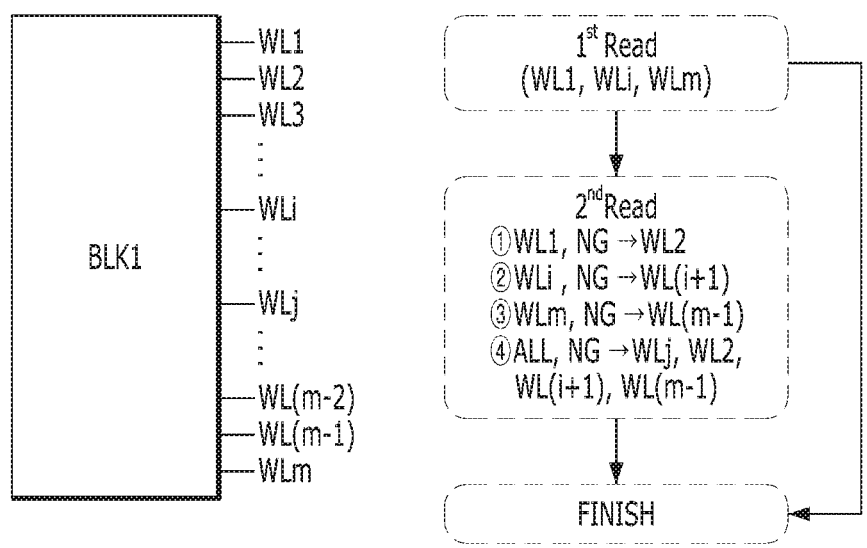
FIG. 7 illustrates a process for estimating an operation status of a memory device according to an embodiment of the disclosure.

FIG. 7 illustrates a process for estimating an operation status of a memory device according to an embodiment of the disclosure.

Referring to FIG. 7, a memory block BLK1 included in the memory device may include a plurality of memory cells connected via a plurality of word lines WL1, WL2, WL3, . . . , WLi, . . . , WLj, . . . , WL(m−2), WL(m−1), WLm. The memory block BLK1 may include a plurality of memory cells connected through m word lines. The number of word lines included in the memory block BLK1 may be different depending on storage capacity, design, and the like of the memory device.

In order to determine an operational state of the memory block BLK1, the controller 130 may select a set number of word lines from the m word lines. In FIG. 7, it is assumed that 3 word lines WL1, WLi, WLm are selected first. The first read test operation ($1^{st}$ Read) may read data stored in a plurality of memory cells connected via the 3 word lines WL1, WLi, WLm.

When no error is found in data outputted from the memory cells connected to the 3 word lines WL1, WLi, WLm, the controller 130 may determine that the operational state of the memory block BLK1 is normal. In addition, the controller 130 may terminate the read test operation for checking the operational state of the memory block BLK1 without performing an additional read test operation on the memory block BLK1.

Although one-stage read test operation may be performed on the memory block BLK1, a two- or three-stage read test operation may be performed to determine the operational state of the memory block BLK1 more accurately. In this case, because no error is found in the data in the first read test operation (1$^{st}$ Read), the number of word lines selected for second or third read test operations (2$^{nd}$ Read or 3$^{rd}$ Read) may be decreased.

When the first read test operation (1$^{st}$ Read) has an error in the data outputted from the memory cells connected via the 3 word lines WL1, WLi, WLm, the second read test operation (2$^{nd}$ Read) may be carried out in various ways, according to an embodiment.

For example, if a piece of data outputted from a plurality of memory cells connected via the first word line WL1 in the first read test operation (1$^{st}$ Read) has an error but can be cured or corrected, e.g., not good but correctable, (NG), the controller 130 may determine that the second read test operation (2$^{nd}$ Read) is to be performed on a plurality of memory cells connected via the second word line WL2.

More generally, if a piece of data outputted from a plurality of memory cells connected via the i-th word line WLi in the first read test operation (1$^{st}$ Read) has an error but can be cured or corrected (NG), the controller 130 may determine that the second read test operation (2$^{nd}$ Read) is to be performed on a plurality of memory cells connected via the (i+1)-th word line WL(i+1).

For example, if a piece of data outputted from a plurality of memory cells connected to the mth word line WLm in the first read test operation (1$^{st}$ Read) has an error but can be cured or corrected (NG), the controller 130 may determine that the second read test operation (2$^{nd}$ Read) may also be performed to a plurality of memory cells connected via the (m−1)-th word line WL(m−1).

In the above described example, when there is a word line connected via a memory cell in which an error is found during the first read test operation (1$^{st}$ Read), another word line near, or adjacent to, the word line may be selected for the second read test operation (2$^{nd}$ Read). In another embodiment, a word line spaced apart by a set distance from the word line selected during the 1$^{st}$ Read may be selected for the second read test operation (2$^{nd}$ Read). For example, when an error is found in any of a plurality of memory cells connected to the first word line WL1, the third word line WL3 or another word line (e.g., WL5) may be selected to perform the second read test operation (2$^{nd}$ Read).

When all pieces of data outputted from the plurality of memory cells connected via the 3 word lines WL1, WLi, and WLm selected in the first read test operation (1$^{st}$ Read) have an error individually but are cured or corrected (NG), the controller 130 may increase the number of word lines for performing the second read test operation (2$^{nd}$ Read). For example, the controller 130 may select 4 word lines WLj, WL2, WL(i+1), WL(m−1) to perform the second read test operation (2$^{nd}$ Read).

As described above, when the read test operation is performed in stages, the number of word lines selected for the current-stage read test operation may be dynamically increased or decreased based on a result of the previous-stage read test operation. Moreover, as indicated above, at least one stage of a read test operation may be performed. According to an embodiment, the read test operation at any particular stage may be performed one or more times. The controller 130 may select some of the word lines WL1 to WLm to perform a stage read test operation, and dynamically select a number of word lines for the next stage read test operation according to the results of the current stage read test operation. That is, the number of word lines selected in the next stage read test operation may be determined by whether an error occurred in the current read test operation. For example, based on how many errors occurred, e.g., in one word line, in more than one word line but less than all, or in all word lines, the number of word line selected in the next stage read test operation may be varied. Although the controller 130 does not perform the read test operation on all the word lines WL1 to WLm included in the memory block BLK1, the controller 130 performs the read test operation in stages or step by step on select word lines, the number of which may increase or decrease in each succeeding stage depending on the results of the immediately previous stage. Because the controller 130 may dynamically change the number of word lines selected in a next stage read test operation according to a result of a previous stage read test operation, the operational state of the memory block BLK1 can be more accurately determined.

As the controller 130 performs multi-stage read test operations for checking the operational state of the memory block BLK1, the number of selected word lines may be increased. That is, as the operational state of the memory block BLK1 is not good (e.g., the number of errors is more than a threshold or is increased), the number of selected word lines for each stage read test operation may be increased, so that the operational state of the memory block BLK1 may be more accurately determined. According to an embodiment, when the number of word lines selected in the memory block BLK1 exceeds a set threshold, the controller 130 may determine that the operational state of the memory block BLK1 is not good (e.g., data stored in the memory block BLK1 might be not safe), and perform a read reclaim operation to the memory block BLK1. Through the read reclaim operation, the controller 130 may copy and move data stored in the memory block BLK1 to another memory block having a better operational state than the memory block BLK1.

According to an embodiment, when it is recognized that the operational state of the memory block BLK1 is not good through the read test operation (e.g., a risk of data loss in the memory block BLK1 might be high), the controller 130 may move data stored in the memory block BLK1 to another memory block and perform a bad block test operation to the corresponding memory block BLK1. Through the bad block test operation, the controller 130 may determine whether the memory block BLK1 is reusable or should not be used because of a high risk of data loss.

Figure 8:
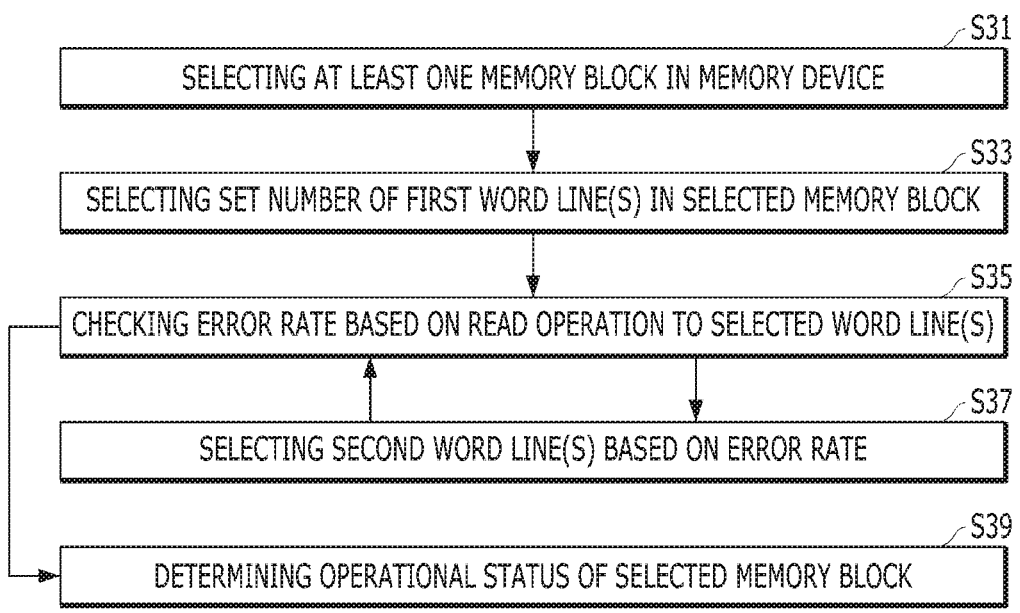
FIG. 8 is a flow chart illustrating a first method for operating a memory system according to an embodiment of the disclosure.

FIG. 8 illustrates a first method for operating a memory system according to an embodiment of the disclosure. Specifically, the first method specifically describes an example of a method of determining an operational state of a memory block.

Referring to FIG. 8, the first method may include selecting at least one memory block in a memory device (S31), selecting a set number of first word line(s) in the selected memory block (S33), and checking an error (or an error rate) of data outputted from a plurality of memory cells coupled via the selected word line(s) through a read operation (S35). After the read operation on the selected word line(s) (i.e., the first word lines), the first method may further include selecting at least one second word line for checking the operational state of the selected memory block(s) based on the error (or the error rate) (S37). Herein, the second word line(s) may be selected among remaining word lines i.e., excluding the first word line(s) selected. According to the first method, the step S35 may be performed again on the second word line(s) selected at the step S37. The first method may further include, at a step S39, determining an operational state of the selected memory block(s) based on a result of checking an error at the step S35.

In the first method illustrated in FIG. 8, two stages of read test operations are performed. However, the method may be extended, as indicated above, to include additional stages, i.e., a third stage, etc. How many, and which, word lines are selected in each of these additional stages is based on the extent or level of error, e.g., number of errors, found in the immediately previous stage.

When an error is not detected in the step S35, it may be determined that an operational state of the memory block is normal. Meanwhile, when an error is detected but such error is below a set threshold in the step S35, a read reclaim operation may be performed on data stored in the memory block.

More specifically, when an error is detected to be less than or equal to a preset threshold in the step S35, it may be determined that an operational state of the memory block is good. Here, the set threshold may be a level at which an error exists in the output data but can be cured or corrected. In an embodiment, the threshold may be indicative of the level (or amount, severity) of the error. In another embodiment, the threshold may specify the maximum number of errors that are correctable through an ECC process such as a hard decision decoding or a soft decision decoding. However, the memory block in which a curable or correctable error is detected may be set as a priority monitored target so that the operational state of the memory block may be frequently monitored.

When an error detected in the read test operation is over the set threshold, a read reclaim operation may be performed on the data in the memory block. In this case, it is determined that there is a high risk that the data stored in the memory block is unstable. Thus, the data can be copied to another memory block having a better operational state in order to avoid data loss or reduce a possibility of recovery failure regarding the error-containing data. The bad block test operation may be performed on the memory block in response to an error found in the read test operation.

In addition, detailed operations related to step S33 of selecting the first word line(s), step S35 of checking the number of errors or error rate, and step S37 of selecting second word line(s), can be further understood based on the operation for estimating an operational state of the memory device described with respect to FIG. 7.

In step S31, each of the memory blocks may be selected because its read count has deviated from a set range during a set time. When the read test operation is performed indiscriminately or randomly, it may adversely affect the plurality of memory blocks in the memory device. Therefore, on which memory block(s) a read test operation is performed may be determined based on at least one parameter representing a status of memory block such as data retention time, read count, program/erase (PIE) count, and the like.

Figure 9:
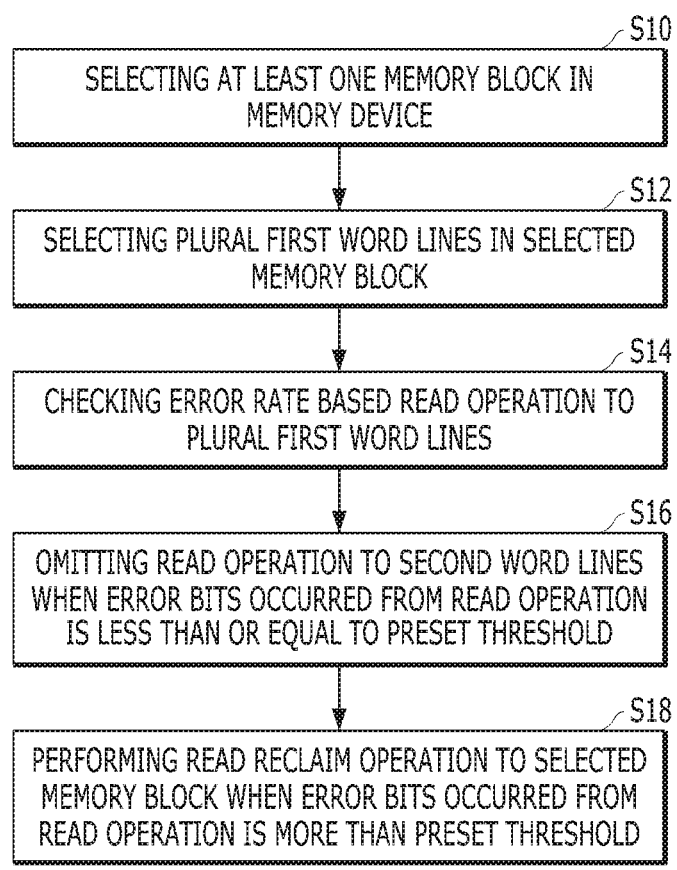
FIG. 9 is a flow chart illustrating a second method for operating a memory system according to an embodiment of the disclosure.

FIG. 9 illustrates a second method of operating a memory system according to an embodiment of the disclosure.

Referring to FIG. 9, the second method can include selecting at least one memory block in the memory device 150 (S10), selecting a plurality of first word lines in a selected memory block according to a set condition (S12), performing a read operation on memory cells coupled to the first word lines (S14), omitting a read operation on a second word line when an error found through the read operation is below a set threshold (S16), and performing a read reclaim operation on the selected memory block(s) when the error found through a read operation on the first word lines is greater than or equal to the set threshold (S18).

The steps of selecting at least one memory block (S10), selecting the first word lines (S12), and performing a read operation on the first word lines (S14) can be fully understood by those skilled in the art, based on the first method described with reference to FIG. 8.

When the number of error bits in data outputted from memory cells connected to the first word lines by the read operation is less than or equal to the set threshold (for example, there is no error), the read test operation may not be performed in stages, as illustrated in FIG. 7.

On the other hand, when the number of errors, outputted through a read operation performed on the memory cells connected to the first word lines, exceeds the set threshold, the memory system may determine that the operation status of the corresponding memory block is not good (e.g., a risk of data loss in the memory block BLK1 might be high). In this case, the data stored in the corresponding memory block may be copied or moved to another memory block. After the data stored in the memory block is copied to another memory block, the data in the memory block can be deleted.

Figure 10:
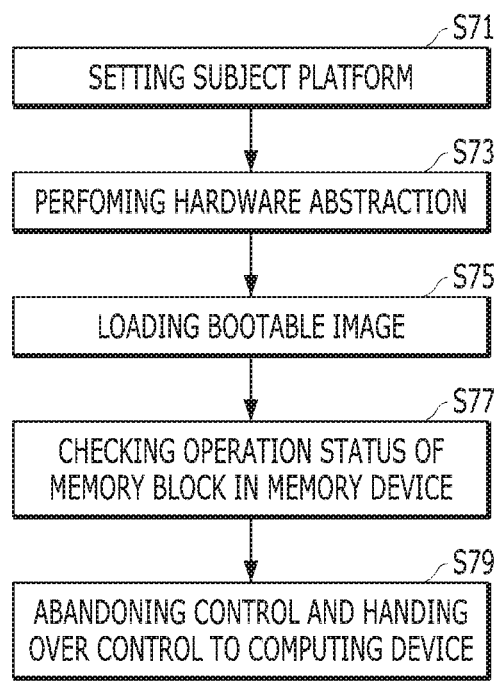
FIG. 10 is a flow chart illustrating an initial operation of a memory system according to an embodiment of the disclosure.

FIG. 10 illustrates an initial operation of the memory system according to an embodiment of the disclosure. FIG. 10 illustrates that the initial operation may be performed in the memory system 110 when power is supplied to the host 102 and the memory system 110 during the operations described with reference to FIGS. 1 to 3. For example, the initial operation can include a boot-up sequence or an operation which may be performed before a host requests user data from the memory system after power is supplied. An operation of the memory system shown in FIG. 10 may vary depending on whether the memory system is mounted on a mobile device, a notebook computer, or a computing device such as a desktop.

Referring to FIG. 10, the operation of the memory system via firmware includes setting a subject platform (step 91), performing hardware abstraction (step 93), loading a bootable image (step 95), checking an operation status regarding a memory block in a memory device (step 97), and abandoning control and handing over control to a computing device which is associated or engaged with the memory device (step 99). Herein, the computing device may include the host 102 shown in FIGS. 1 to 7.

The setting step 91 of the subject platform may be performed by preparing an environment for booting an operating system (OS), thereby confirming whether the subject platform has been initialized.

In this step, exact core type and platform should be found and recognized because the same executable image can be performed on different cores or platforms. By way of example but not limitation, the type of core may be stored in the 0th register of a co-processor. The type of platform may be determined by checking whether a specific peripheral device exists or reading information stored in the chip.

In addition, in accordance with an embodiment, in step 91 of setting the subject platform, diagnostic software may be used to determine whether a hardware component is defective.

In addition, in accordance with an embodiment, in step 91 of setting the subject platform, any problem of the hardware found through the diagnostic software may be debugged according to debugging code or the like.

The step 93 of hardware abstraction may be performed through a hardware abstract layer (HAL), which is a software layer that hides hardware through a set of defined programming interfaces. By way of example but not limitation, the hardware abstraction layer (HAL) may include software or drivers that enable a processor within the controller 130 to communicate with specific peripheral hardware.

The step 95 of loading a bootable image may include forwarding or executing an operating system or an application program included in the user data area to a host or a computing device that is engaged or associated with the memory system. Operating systems or application programs may be of various types, and there may be differences in a way they are executed depending on their type. In addition, the firmware functionality may vary depending on a type of media used to store the boot image. For example, a type that stores an operating system or an application program may be a Flash ROM File System (FFS), a binary image, a Common Object File Format (COFS), or an Executable and Linking Format (ELF).

The step 97 of checking an operation status of a memory block in the memory device is for determining whether the memory system can perform a new program operation which is caused through an internal operation or requested from another device (e.g., a computing device). The operation status regarding the memory block may be checked based on recognized characteristics or types of plural memory blocks included in the memory device. For example, the memory system may estimate the status of each memory block based on parameters or information such as read count, program/erase count, valid page count, etc., which is associated with a plurality of memory blocks included in the memory device. Further, as shown in FIG. 1, an operation status of a corresponding memory block may be recognized through a method of accessing a specific memory block and reading data stored in the specific memory block. In order to reduce repetitive accesses to the specific memory block, a set amount of dummy data can be programmed in the specific memory block after the memory system accesses the specific memory block in order to recognize or check the operation status of the specific memory block.

The step 99 of handing over (or passing) control to a computing device that is engaged with the memory system may be performed by a boot loader included in the firmware. The step of handing over the control (step 99) may include a step of passing control of the recognized platform from the firmware into the operating system or the application program.

In FIG. 10, the initial operation performed in the memory system is described. However, even in an environment in which the memory system is operating, a read test operation may be performed based on at least one parameter such as data retention time, read count, and program/erase (P/E) count regarding the memory block. According to an embodiment, the read test operation may be performed as a background operation performed in the memory system. Herein, the background operation may include a process run independently of a user or an external device (e.g., host). The read test operation may be performed while the memory system is in an idle state.

According to embodiments of the disclosure, a memory system, a data processing system, a method of operating the same, and a method of verifying an operation performed in the same may provide an efficient method for checking operation status of the memory device, so that operation speed of the memory system may be improved and operation overhead of the memory system may be reduced.

In addition, an embodiment of the disclosure can determine a method for dynamically checking an operation status of the memory device based on an operation condition or an operation circumstance of the memory system, so that a method and an apparatus for accurately estimating or determining the operation status regarding the memory device may be provided. Accordingly, it is possible to avoid performing, or reduce the likelihood of performing, an unnecessary operation in the memory system and to improve operation performance of the memory system.

While the present invention has been illustrated and described with respect to the specific embodiments, it will be apparent to those skilled in the art in light of the present disclosure that various changes and modifications may be made without departing from the spirit and scope of the invention as defined in the following claims. The present invention encompasses all such changes and modifications that fall within the scope of the claims.

What is claimed is:

1. A memory system, comprising:
a memory device including a plurality of memory blocks, each including a plurality of memory cells coupled to a plurality of word lines; and
a controller configured to:
select a memory block among the plurality of memory blocks;
select a first word line group within a selected memory block to perform a first read test operation, and check an error included in data corresponding to the first word line group;
select a second word line group based on the error within the selected memory block to perform a second read test operation;
determine that an operation status regarding the selected memory block is normal when there is no error in the first and second read test operations;
determine that the operation status is good when the error detected in the first and second read test operations is below a threshold;
determine that the operation status is not good when the error detected in the first and second read test operations is over the threshold;
perform a read reclaim operation on the selected memory block when the operation status regarding the selected memory block is good, wherein the read reclaim operation includes copying or moving data stored in the selected memory block to another memory block having a better operation status than the selected memory block; and
perform a read reclaim operation on the selected memory block and then perform a bad block test operation to determine whether the selected memory block is reusable or not, when the operation status regarding the selected memory block is not good.

2. The memory system according to claim 1, wherein, in performing each of the first and second read test operations, the controller is configured to:
selects some word lines within the selected memory block as one of the first and second word line groups based on the error;
read data stored in memory cells coupled to the selected word lines; and
check the number of errors in the read data.

3. The memory system according to claim 2, wherein the number of word lines as the second word line group in the second read test operation is different from the number of word lines as the first word line group in the first read test operation, based on the error detected in the first read test operation.

4. The memory system according to claim 3, wherein at least one word line selected in the second read test operation is spaced a set distance apart from a word line selected in the first read test operation and in which the error was detected in the first read test operation.

5. The memory system according to claim 2, wherein adjacent word lines selected in the second read test operation are spaced apart from each other by a different distance than adjacent word lines selected in the first read test operation.

6. The memory system according to claim 1, wherein the controller further sets the selected memory block as a priority monitored target when the operation status regarding the selected memory block is good.

7. The memory system according to claim 1, wherein the controller is further configured to perform a wear leveling operation to the memory device when a number of memory blocks, each having a number of errors greater than or equal to an error threshold, is more than the threshold.

8. The memory system according to claim 1, wherein the memory block in which the first and second read test operations are performed is selected based on a read count deviated from a set range during a set period.

9. A method for operating a memory system, the method comprising:
   determining whether to perform a first read test operation for determining an operation status of a memory block based on a set condition;
   selecting a first word line group within the memory block to perform the first read test operation;
   checking an error included in data corresponding to the first word group;
   selecting a second word line group based on the error within the memory block to perform a second read test operation;
   determining that an operation status of the memory block is normal when there is no error in the first and second read test operations;
   determining that the operation status is good when the error detected in the first and second read test operations is below a threshold;
   determining that the operation status is not good when the error detected in the first and second read test operations is over the threshold;
   performing a read reclaim operation on the selected memory block when the operation status regarding the selected memory block is good, wherein the read reclaim operation includes copying or moving data stored in the selected memory block to another memory block having a better operation status than the selected memory block; and
   performing a read reclaim operation on the selected memory block and then performing a bad block test operation to determine whether the selected memory block is reusable or not, when the operation status regarding the selected memory block is not good.

10. The method according to claim 9, wherein each of the first and second read test operations includes:
    selecting some word lines within the memory block as one of the first and second word line groups based on the error;
    reading data stored in memory cells coupled to the selected word lines; and
    checking the number of errors in the read data.

11. The method according to claim 10, wherein the number of word lines selected in the second read test operation is based on the number of errors detected in the first read test operation.

12. The method according to claim 11, wherein at least one word line selected in the second read test operation is spaced a set distance apart from a word line selected in the first read test operation and in which the error was detected in the first read test operation.

13. The method according to claim 10, wherein adjacent word lines selected in the second read test operation are spaced apart from each other by a different distance than adjacent word lines selected in the first read test operation.

14. The method according to claim 9, further comprising:
    setting the memory block as a priority monitored target when the operation status regarding the selected memory block is good.

15. The method according to claim 9, further comprising performing a wear leveling operation to the memory device when a number of memory blocks, each having a number of errors greater than or equal to an error threshold, is more than the threshold.

16. The method according to claim 9, wherein the memory block in which the first and second read test operations are performed is selected based on a read count deviated from a set range during a set period.

* * * * *